US006867628B2

(12) United States Patent
Cho et al.

(10) Patent No.: US 6,867,628 B2
(45) Date of Patent: Mar. 15, 2005

(54) SEMICONDUCTOR MEMORY DELAY CIRCUIT

(75) Inventors: Ji-Ho Cho, Suwon-shi (KR); Seung-Keun Lee, Seongnam-shi (KR)

(73) Assignee: Samsung Electronics Co. Ltd., Suwon (KR)

( * ) Notice: Subject to any disclaimer, the term of this patent is extended or adjusted under 35 U.S.C. 154(b) by 0 days.

(21) Appl. No.: 10/405,357

(22) Filed: Apr. 3, 2003

(65) Prior Publication Data

US 2003/0193359 A1 Oct. 16, 2003

(30) Foreign Application Priority Data

Apr. 12, 2002 (KR) ................................ 10-2002-0019951

(51) Int. Cl.[7] ................................................ H03H 11/26

(52) U.S. Cl. ........................ 327/262; 327/268; 327/284

(58) Field of Search ................................ 327/261–264, 327/271–272, 284, 285, 392, 394, 395, 398, 399, 401, 268

(56) References Cited

U.S. PATENT DOCUMENTS 5,767,719 A * 6/1998 Furuchi et al. ............. 327/281
5,801,567 A * 9/1998 Kosiec ....................... 327/263
5,861,765 A * 1/1999 Hirai .......................... 327/261
5,986,492 A * 11/1999 Hobbs ........................ 327/284
6,034,557 A * 3/2000 Schultz et al. .............. 327/276
6,044,027 A * 3/2000 Zheng et al. ............... 365/194
6,150,864 A * 11/2000 Yach et al. ................. 327/288
6,262,616 B1 * 7/2001 Srinivasan et al. ......... 327/264
6,300,813 B1 * 10/2001 Matsui ....................... 327/288
6,323,712 B1 * 11/2001 Shih ........................... 327/276
6,529,058 B2 * 3/2003 Gupta ........................ 327/276
6,624,680 B2 * 9/2003 Schenck ..................... 327/262

* cited by examiner

*Primary Examiner*—Timothy P. Callahan
*Assistant Examiner*—Hai L. Nguyen
(74) *Attorney, Agent, or Firm*—Harness, Dickey & Pierce, PLC

(57) ABSTRACT

A circuit includes an input for receiving an input signal, a delay chain connected to the input for delaying the input signal, and a circuit configuration connected to the delay chain downstream of the input, the circuit configuration for supplying a voltage to the delay chain in response to the input signal.

18 Claims, 7 Drawing Sheets

Vdd
607
B
609
608
A1
IN
OUT
601
602
603
604
605
606

IN
Vdd = 3.5v
Vdd = 2.5v
Vdd = 1.5v
Node A1
Vdd = 3.5v
Vdd = 2.5v
Vdd = 1.5v
TP1
TP2
TP3
OUT
Vdd = 3.5v
Vdd = 2.5v
Vdd = 1.5v (CONVENT ONAL ART)

SEMICONDUCTOR MEMORY DELAY CIRCUIT

This U.S. nonprovisional patent application claims priority under 35 U.S.C. §119 to Korean Patent Application No. 2002-19951, filed on Apr. 12, 2002, the entire contents of which are hereby incorporated herein by reference.

FIELD OF THE INVENTION

The present invention generally relates to semiconductor memories and, in particular, to semiconductor memories employing delay circuits.

BACKGROUND OF THE INVENTION

Semiconductor memories may control internal circuits thereof by way of signals having various operation timings. Delay circuits may be employed along signal propagation paths in order to establish such various signal operation timings. In particular, high-frequency memories, such as DRAMs, SRAMs, and flash memories, may utilize address transition detection (ATD) circuits to access memory core circuits, such as sense amplifiers and memory cells, in response to address transitions.

FIG. 1 illustrates a conventional general flash memory. The general flash memory may include an address buffer 110, a wordline decoder 120, a bitline decoder 130, a memory cell block 140, an ATD circuit 150, a sense amplifier 160, and an input/output buffer 170. The address buffer 110 is generally capable of transferring external address signals to the wordline and bitline decoders, 120 and 130. A data bit of a memory cell designated by the wordline and bitline decoder 120 and 130 may be driven into the input/output buffer 170 by way of the sense amplifier 160. The sense amplifier 160 is capable of determining a validity of data read out from the selected memory cell. The sense amplifier 160 may also receive signals from the ATD circuit 150, which includes a delay circuit 200. These signals instruct the sense amplifier 160 to exhaust charges on a bitline that may remain after data is sensed. Moreover, the signals from the ATD circuit 150 and the delay circuit 200 may be used to activate the sense amplifier 160.

Generally, operating speeds of integrated circuits are proportional to a power supply voltage (Vdd) level. A higher Vdd often enhances operating speeds, while a lower Vdd often degrades operating speeds. Thus, signals generated from the delay circuit 200 may have different timings as power supply voltage levels vary.

FIG. 2 illustrates the conventional delay circuit 200. The delay circuit 200 may include an inverter 201, a resistor 202, a capacitor 203, an inverter 204, and a NAND gate 205. An input signal at input IN may be applied to one input terminal of the NAND gate 205 through the inverters 201 and 24, and the resistor 202. As is illustrated, the input signal may also be applied to another input terminal of the NAND gate 205.

FIG. 3 illustrates an operational timing diagram of the conventional delay circuit 200 of FIG. 2. As is illustrated, different transition times occur between the input IN node, the intermediate node A, and an output OUT node, in accordance with power supply voltage Vdd variations. The input signal has a longer transition time at Vdd=1.5V than when Vdd=3.5V. Accordingly, the node A, which responds to a rising edge of the input signal passing through the inverter 201, the resistor 202, and the capacitor 203, will reach a low level slower when Vdd=1.5V than when Vdd=3.5V. An output signal generated from the NAND gate 205 responds to a trigger point (T1, T2, or T3) at the node A. As a result, the output signal transitions slower when Vdd=1.5V than when Vdd=3.5V.

Output signal fluctuations from an ATD circuit, along variations of a power supply voltage, may result in memory device malfunctions.

SUMMARY OF THE INVENTION

An exemplary embodiment of the present invention provides a delay circuit having a substantially stable output signal.

An exemplary embodiment of the present invention includes a circuit having an input for receiving an input signal, a delay chain connected to the input for delaying the input signal, and a circuit configuration connected to the delay chain downstream of the input, the circuit configuration for supplying a voltage to the delay chain in response to the input signal.

Another exemplary embodiment of the present invention provides an arrangement that includes a circuit arrangement having an input and an output, and a voltage source coupled to the circuit arrangement downstream of the input, the voltage source actuatable in response to a signal input at the input.

Yet another exemplary embodiment provides a method that includes biasing a transistor to charge a capacitor coupled to a source of the transistor, and discharging the capacitor through another transistor to supply a voltage to a delay circuit.

Another exemplary embodiment of the present invention provides a method that provides a circuit arrangement; and that substantially harmonizes transition points of signals input to the circuit arrangement regardless a voltage levels of the signals.

Further scope of applicability of exemplary embodiments of the present invention will become apparent from the detailed description given hereinafter. However, it should be understood that the detailed description and specific examples, while indicating exemplary embodiments of the present invention, are given by way of illustration only, since various changes and modifications within the spirit and scope of the invention will become apparent to those skilled in the art from this detailed description.

BRIEF DESCRIPTION OF THE DRAWINGS

Exemplary embodiments of the present invention will become more fully understood from the detailed description given hereinbelow and the accompanying drawings which are given by way of illustration only, and thus are not limitative of the present invention, and wherein.

DETAILED DESCRIPTION OF THE EXEMPLARY EMBODIMENTS

It should be understood that the following description of the exemplary embodiments is merely illustrative and should not be considered as limiting of the claimed invention.

Figure 1:
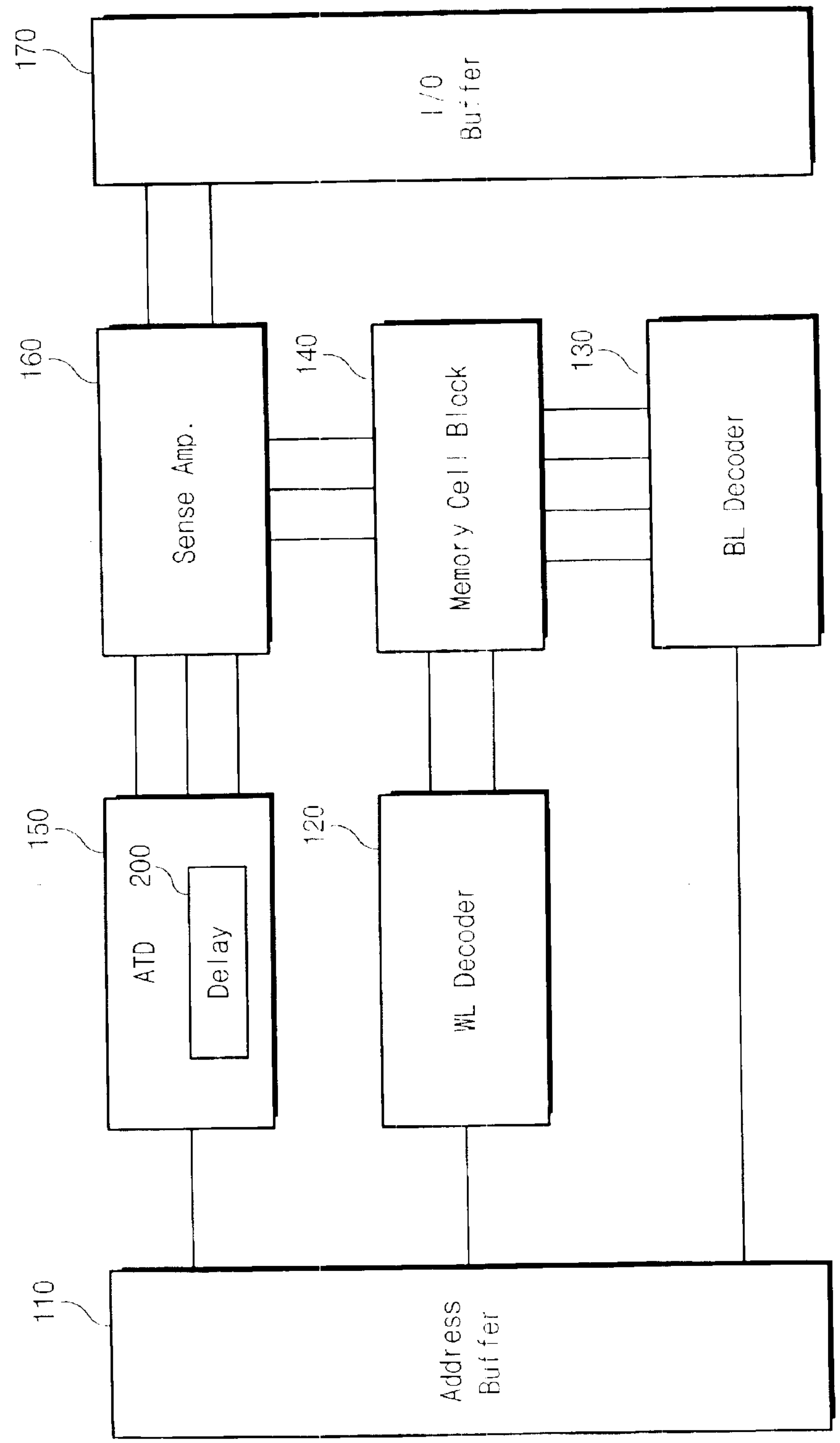
FIG. 1 illustrates a conventional general flash memory.
Figure 2:
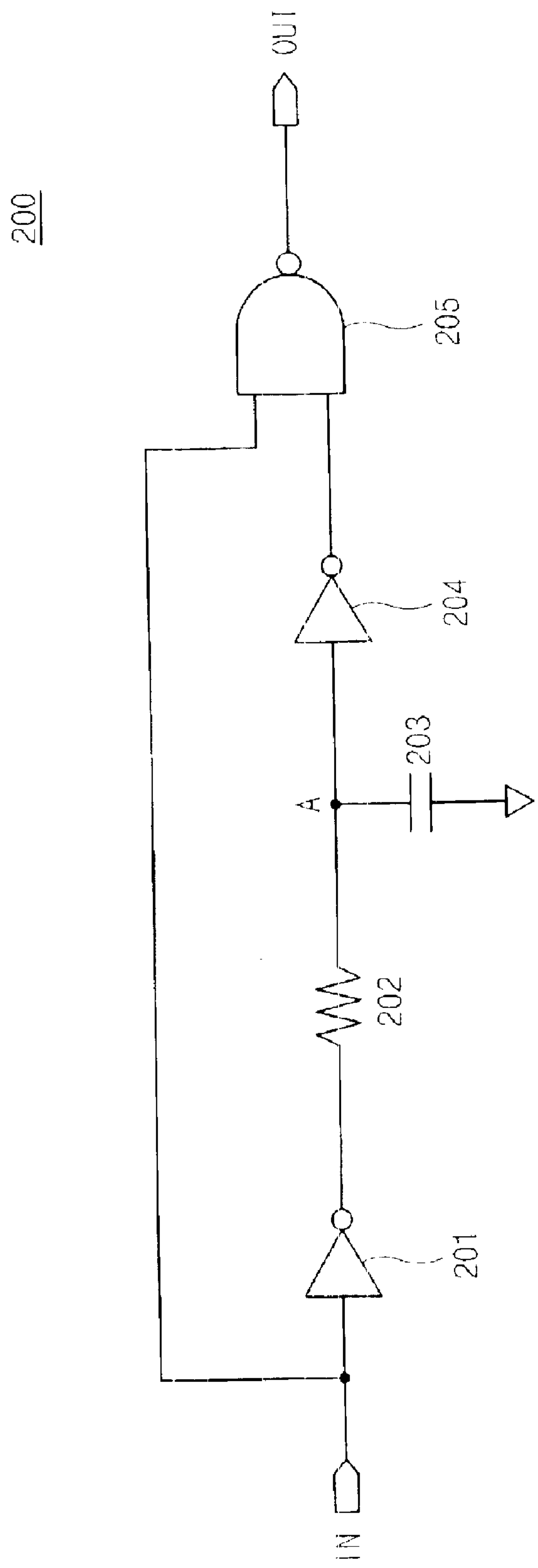
FIG. 2 illustrates a conventional delay circuit.
Figure 3:
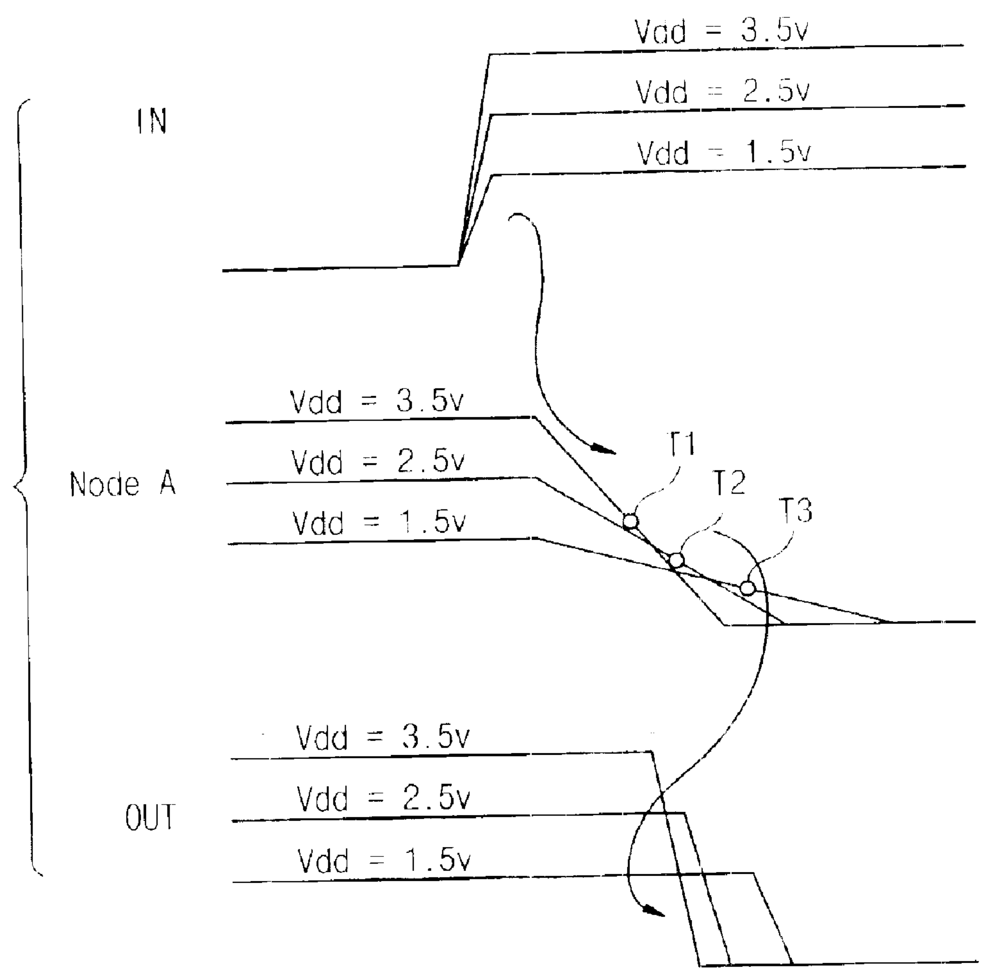
FIG. 3 illustrates an operational timing diagram of the conventional delay circuit of FIG. 2.
Figure 4:
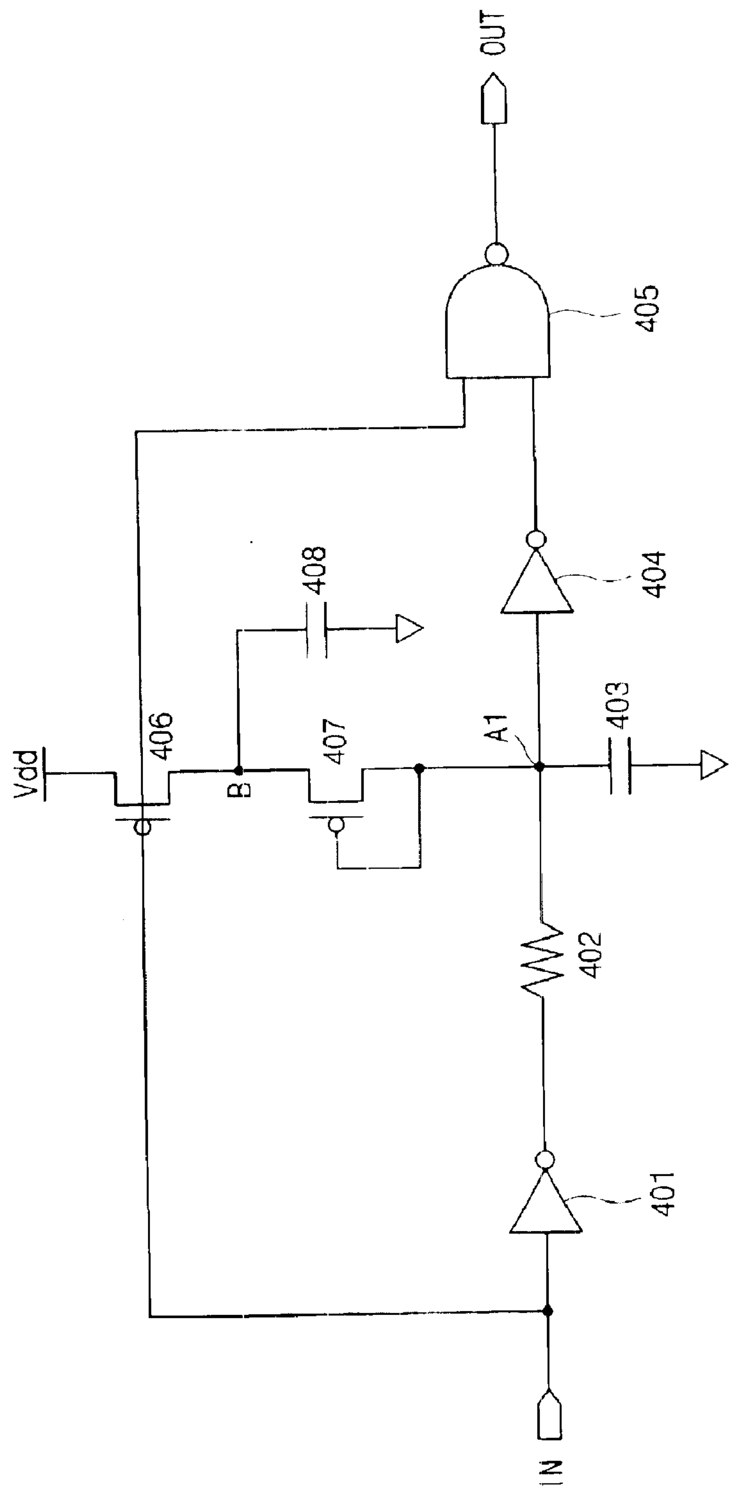
FIG. 4 illustrates a circuit diagram of a delay circuit according to an exemplary embodiment of the present invention.

In the following detailed description, specific details are set forth in order to provide a thorough understanding of the exemplary embodiments of the present invention. It will be obvious, however, to one skilled in the art that the exemplary embodiments of the present invention may be practiced without these specific details FIG. 4 illustrates a circuit diagram of a delay circuit according to an exemplary embodiment of the present invention. Such a delay circuit as illustrated in FIG. 4 may be used in general flash memories. For example, the delay circuits according to the exemplary embodiments of the present invention may be used with a general flash memory as illustrated in FIG. 1. However, the exemplary embodiments may be implemented in other circuit arrangements as design requires.

Referring to FIG. 4, the delay circuit may include an inverter 401, a resistor 402, a capacitor 403, an inverter 404, a NAND gate 405, a PMOS transistor 406, a PMOS transistor 407, and a capacitor 408. The inverter 401, the resistor 402, and the inverter 404 may be connected in series between an input IN and one input of the NAND gate 405. A node A1 between the resistor 402 and the inverter 404 may be coupled to one electrode of the capacitor 403. The other electrode of the capacitor 403 may be grounded. An input signal IN may be directly applied to an input of the NAND gate 405 and a gate of the PMOS transistor 406 connected between a power supply voltage Vdd and a node B. The node B may be connected to the node A1 through the PMOS transistor 407, which has a gate coupled to the node T1. The capacitor 408 may be coupled between the node B and ground.

Figure 5:
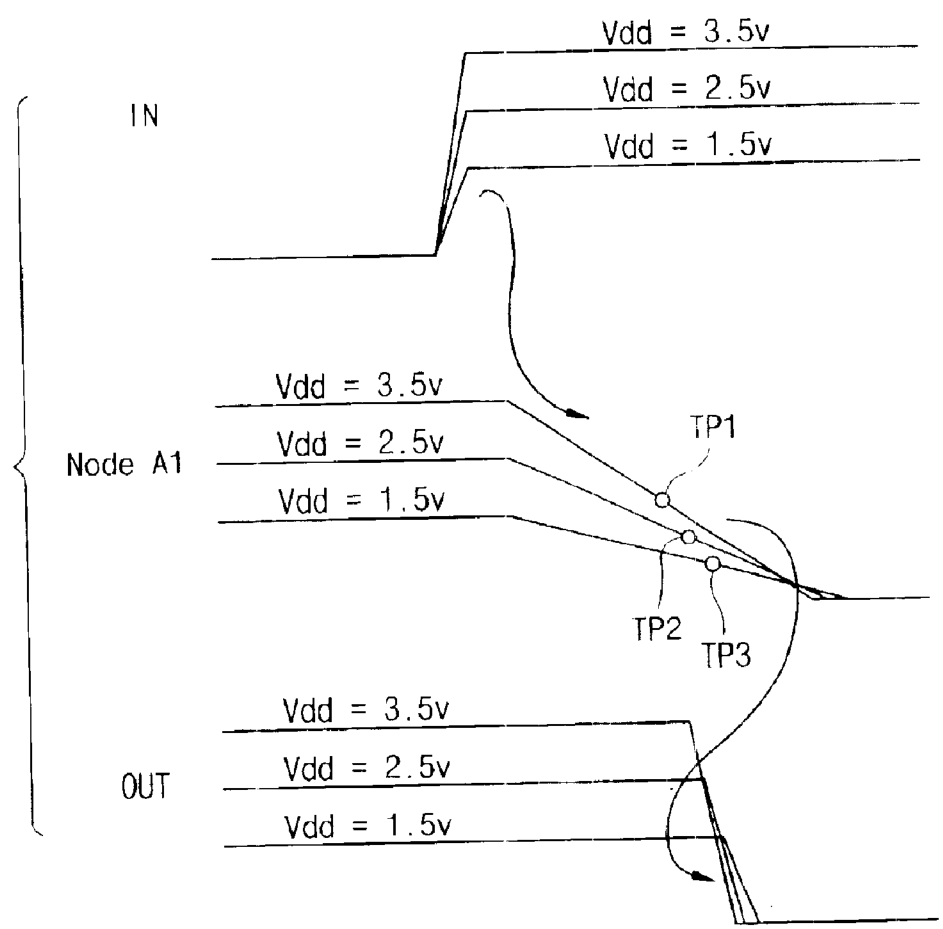
FIG. 5 illustrates a timing diagram showing output characteristics of the delay circuit of FIG. 4.

FIG. 5 illustrates a timing diagram showing output characteristics of the delay circuit of FIG. 4. When a low level signal is input at the input IN, the node A1 is set to a high level through the inverter 401. Additionally, the low level signal actuates the PMOS transistor 406, allowing Vdd through to the node B. The Vdd at node B increases a voltage level of the node A1. Moreover, as a result of the actuation of the PMOS transistor 406, the capacitor 408 coupled to the node B is charged up to Vdd. The diode-coupled PMOS transistor 407 remains in an off state, even in a channel conduction state, because a voltage difference between its source (the node B) and drain (the node A1) is not present.

When a high level signal is input at the input IN, the node A1 is set to a low level state by way of the inverter 401. Moreover, the high level signal causes the PMOS transistor 406 to remain in an off state, or causes the transistor 406 to transition to an off state. This allows the capacitor 408 to discharge. The discharge voltage actuates the PMOS transistor 407, thereby allowing current to flow between the node A1 and the node B. In an exemplary embodiment of the present invention, the discharge voltage at node B is Vdd.

Because the charge rate of the capacitor 408 at Vdd=3.5V is larger than that when Vdd=1.5V, the node A1 may transition to a low level slower when Vdd=3.5V as compared to when Vdd=1.5V. However, when Vdd is approximately 1.5V, a transition at node A1 is not modified, since the PMOS transistor 407 is not fully conductive. Therefore, the delay circuit of FIG. 4 reduces the difference of transition speeds (or times) at the node A1 in accordance with the variation of the power supply voltage.

FIG. 5 illustrates a timing diagram showing output characteristics of the delay circuit of FIG. 4. As is illustrated, trigger points TP1~TP3 occur in a tight cluster as a result of the delay circuit according to an exemplary embodiment of the present invention.

A voltage signal at the node A1 may be applied to the NAND gate 405 after passing through the inverter 404. Since, an output of the NAND gate 405 may be dependent upon a voltage transition occurring at the node A1, an output signal at the output OUT may change to a low level in response to the trigger point at the node A1. However, since the trigger points TP1~TP3 occur in a very tight cluster, output signal transitions occur at substantially the same time regardless of the level of the power supply voltage (1.5V, 2.5V, or 3.5V).

Figure 6:
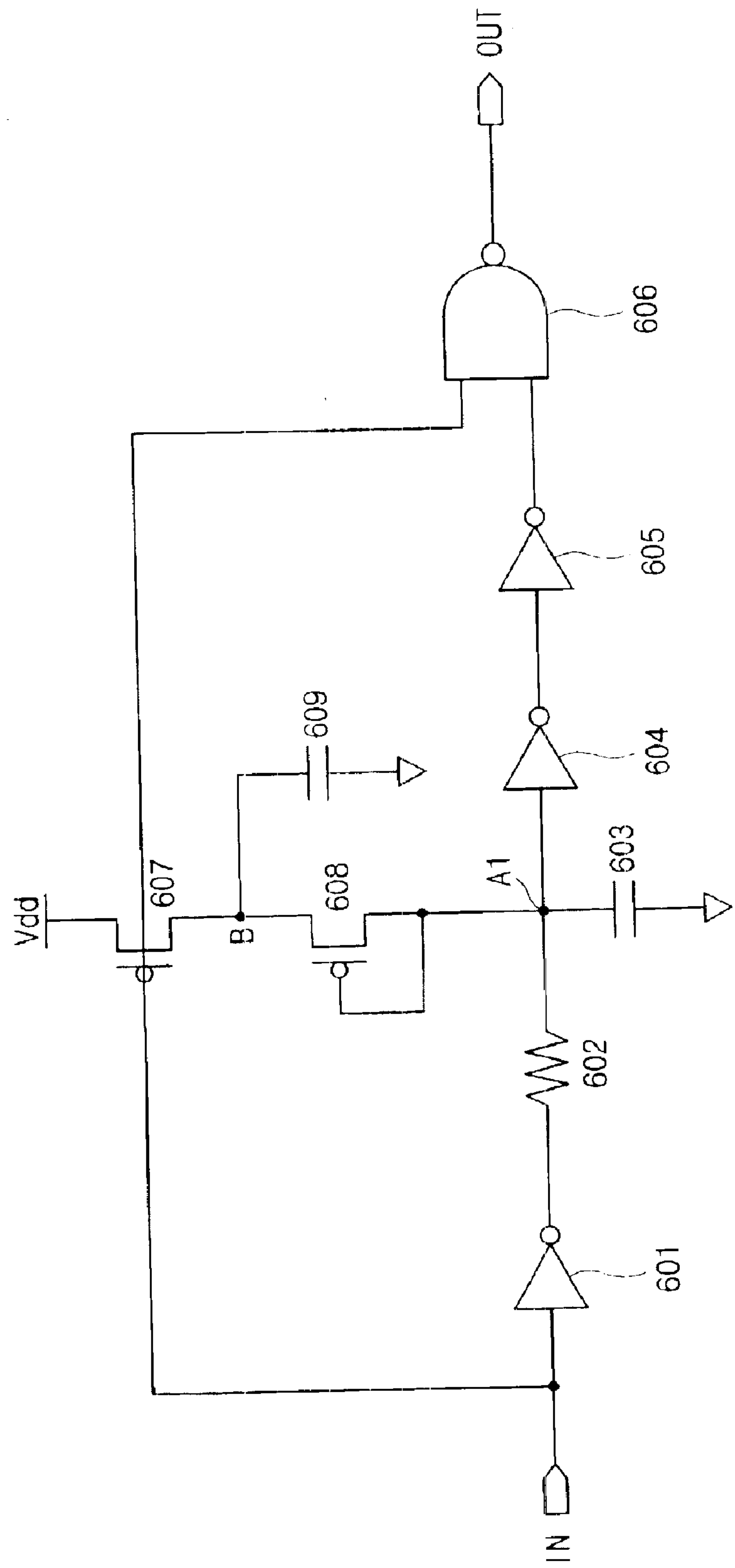
FIG. 6 illustrates a circuit diagram of a delay circuit according to another exemplary embodiment of the present invention.
Figure 7:
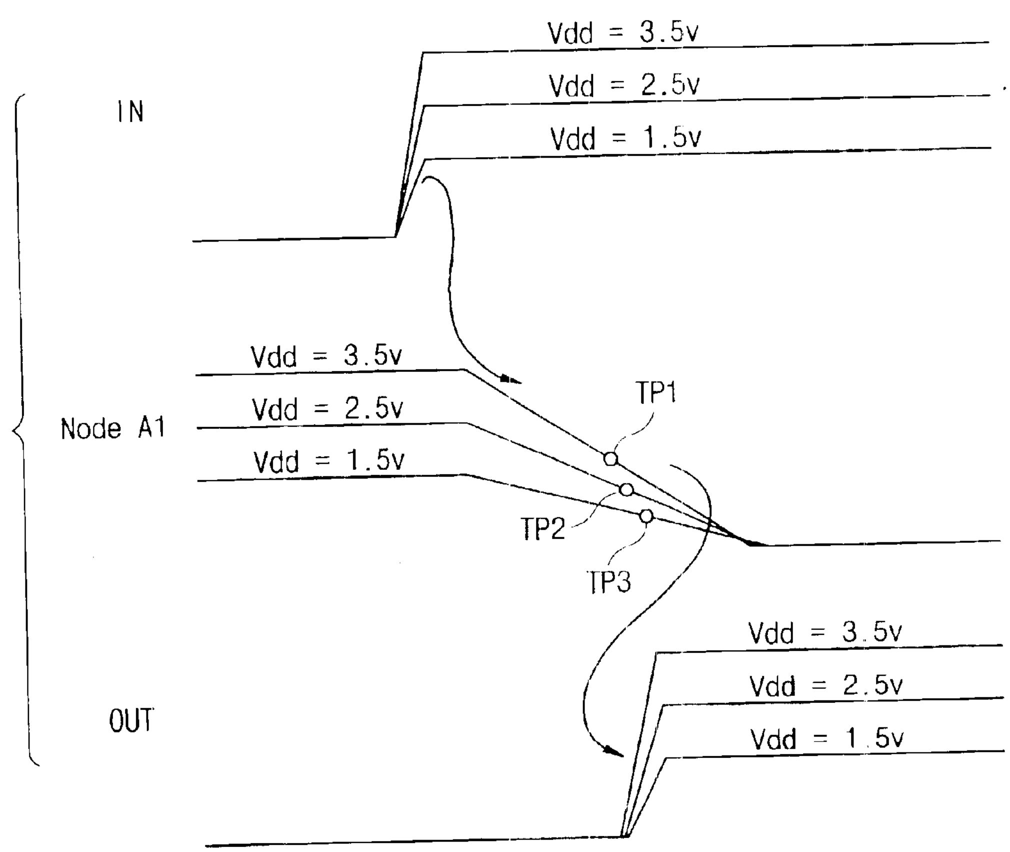
FIG. 7 illustrates a timing diagram showing output characteristics of the delay circuit shown in FIG. 6.

FIG. 6 illustrates a circuit diagram of a delay circuit according to another exemplary embodiment of the present invention. FIG. 7 illustrates a timing diagram showing output characteristics of the delay circuit shown in FIG. 6. The delay circuit illustrated in FIG. 6 is substantially the same as that illustrated in FIG. 4. However, the delay circuit of FIG. 4 includes an inverter 605 connected serially between the inverter 604 (corresponding to the inverter 404 of FIG. 4) and the input of the NAND gate 606 (corresponding to 405 of FIG. 4). Therefore, an output signal from output signal OUT has a logical state opposite than the output signal illustrated in FIG. 5. As an alternative, the both inverters 604 and 604 may be removed to achieve the output illustrated in the timing diagram of FIG. 7.

The exemplary embodiments of the present invention have been described using substantially three voltage levels and three transition points. However, the exemplary embodiments of the present invention are merely illustrative of the present invention. Therefore, exemplary embodiments that operate with varying voltage levels and transition points are also within the scope of the present invention.

Additionally, the exemplary embodiments of the present invention have been described generally as circuits. As is understood by those of ordinary skill in the art, the exemplary embodiments of the present invention may be realized using conventional circuitry (i.e., resistors, capacitors, etc.), prepackaged logic devices (i.e., integrated circuits (ICs), gates, etc.), and/or software (Matlab®, Labview®, etc.).

Exemplary embodiments of the present invention have been disclosed for illustrative purposes, and those skilled in the art will appreciate that various modifications, additions and substitutions are possible, without departing from the scope and spirit of the invention as described in the accompanying claims.

What is claimed is:

1. A circuit, comprising:

an input for receiving an input signal;

a delay chain connected to the input for delaying the input signal; and a power supply connected to the delay chain downstream of the input for supplying a power supply voltage to the delay chain in response to the input signal, wherein a transition rate from a first level to a second level of the power supply voltage supplied to the delay chain is substantially the same regardless of the level of the power supply voltage supplied to the delay chain.

2. The circuit of claim 1, wherein the circuit further comprises:

a capacitor;

a first transistor connected to the power supply and to the capacitor; and a second transistor connected to the capacitor and to the delay chain.

3. The circuit of claim 1, wherein the delay chain comprises:

a first inverter connected to the input;

a resistor connected to the inverter;

a capacitor connected to the resistor; and a second inverter connected to the resistor and the capacitor.

4. The circuit of claim 3, wherein the delay chain further comprises a third inverter connected to the second inverter.

5. The circuit of claim 3, wherein the delay chain further comprises a logic gate having two inputs, one input connected to the second inverter and the other input connected to the input.

6. The circuit of claim 5, wherein the logic gate is a NAND gate.

7. The circuit of claim 5, wherein the other input of the logic gate is directly connected to the input.

8. An arrangement, comprising:

a circuit arrangement having an input, a delay chain and an output; and a voltage source coupled to the circuit arrangement downstream of the input and adapted to respond to a signal received at the input, wherein a transition rate from a first level to a second level of the voltage supplied to the delay chain by the voltage source is substantially the same regardless of the level of the voltage supplied to the delay chain.

9. The arrangement of claim 8, wherein the voltage source is coupled to the circuit arrangement via first and second transistors.

10. The arrangement of claim 9, wherein a capacitor is coupled to a node positioned between the first and second transistors.

11. The arrangement of claim 10, wherein a first voltage level signal input at the input activates the first transistor to allow voltage to flow and charge the capacitor.

12. The arrangement of claim 11, wherein a second voltage level signal input at the input allows the capacitor to discharge voltage through the second transistor to the circuit arrangement.

13. The arrangement of claim 8, wherein the circuit arrangement is a delay circuit.

14. A method, comprising:

biasing a transistor to charge a capacitor coupled to a source of the transistor; and discharging the capacitor through another transistor to supply a voltage to a delay circuit, wherein a transition rate from a first level to a second level of the voltage supplied to the delay circuit is substantially the same regardless of the level of voltage supplied to the delay circuit.

15. The method of claim 14, further comprising disabling the transistor to allow the discharging of the capacitor, the disabling of the transistor effectively biasing the another transistor.

16. The method of claim 14, further comprising receiving the voltage downstream of an input of the delay circuit.

17. The method of claim 14, wherein said method is performed.

18. A method, comprising:

providing a circuit arrangement; and substantially harmonizing transition points of signals input to the circuit arrangement regardless of voltage levels of the signals, so that a transition rate from a first level to a second level of a voltage supplied to a delay chain in the circuit arrangement is substantially the same regardless of the level of the voltage supplied to the delay chain.

* * * * *